United States Patent [19]

Kosiak et al.

[11] Patent Number: 5,047,358

[45] Date of Patent: Sep. 10, 1991

[54] PROCESS FOR FORMING HIGH AND LOW VOLTAGE CMOS TRANSISTORS ON A SINGLE INTEGRATED CIRCUIT CHIP

[75] Inventors: Walter K. Kosiak; Douglas R. Schnabel; Jonathan D. Mann; Jack D. Parrish; Paul R. Rowlands, III, all of Kokomo, Ind.

[73] Assignee: Delco Electronics Corporation, Kokomo, Ind.

[21] Appl. No.: 324,869

[22] Filed: Mar. 17, 1989

[51] Int. Cl.$^5$ .......................... H01L 21/265
[52] U.S. Cl. ........................ 437/34; 437/44; 437/57; 357/42
[58] Field of Search ........ 437/44, 34, 56, 57, 437/58; 357/42

[56] References Cited

U.S. PATENT DOCUMENTS 4,628,341  12/1986  Thomas ................................ 357/42

OTHER PUBLICATIONS

J. D. Plummer, "Monolithic MOS High Voltage Integrated Circuits," Proceedings of Electron Devices International Conference, Feb. 1980 (copy available for IEEE).

Editorial, "Technology to Watch-National's CMOS Process Tailored for Analog ICs," Electronics, Feb. 6, 1987, pp. 75-76.

H. Hayama et al., "High Voltage CMOSIC with a Novel Diffused Well Structure," Proceedings of Custom Integrated Circuits Conference, Jul. 1987 (copy available from IEEE).

G. M. Dolny et al., "Enhanced CMOS for Analog-Digital Power IC Applications," IEEE Transactions on Electron Devices, vol. ED-33, No. 12, pp. 1985-1991 (Dec. 1986).

P. M. Zeitzoff et al., "An Isolated Vertical n-p-n Transistor in an n-Well CMOS Process," IEEE Journal of Solid State Circuits, vol. SC-20, No. 2, pp. 489-494 (Apr. 1985).

M. D. Hartranft et al., "An Integrable 60 Volt A.C. Power MOSFET," Proceedings of Custom Integrated Circuits Conference, Aug. 1980 (copy available from IEEE).

R. S. Ronen et al., "Integrated High Zoltage MOS Driver Arrays," Proceedings of Custom Integrated Circuits Conference, Aug. 1980 (copy available from IEEE).

S. Ogura et al., "Design and Characteristics of the Lightly Doped Drain-Source (LDD) Insulated Gate FIeld-Effect Transistor," IEEE Transaction of Electron Devices, vol. ED-27, No. 8, pp. 1359-1367 (Aug. 1980).

J. Lee et al., "A Theoretical Study of Gate/Drain Offset in LDD MPSFET's," IEEE Electron Device Letters, vol. EDL-7, No. 3, pp. 152-154 (Mar. 1986).

A. W. Ludikhuize, "High-Voltage DMOS and PMOS in Analog IC's," Proceedings of the IEDM (International Electron Devices Meeting) Dec. 1982.

J. Tihanyi, "A Qualitative Study of the DC Performance of SIPMOS Transistors," Siemens Forsch.-u. Entwickl.-Ber., Bd. 9 (1980) Nr. 4 (Springer-Verlag 1980).

Primary Examiner—Olik Chaudhuri
Assistant Examiner—Long Pham
Attorney, Agent, or Firm—Robert Wallace

[57] ABSTRACT

A process for forming both low voltage CMOS transistors and high voltage CMOS transistors on a common integrated circuit chip uses a common implantation and drive-in step to form both the n-type well of each PMOS transistor and the n-type drain extension well of each lightly doped drain (LDD) NMOS transistor and a separate implant and drive-in to form the p-type drain extension well of each LDD PMOS transistor.

5 Claims, 4 Drawing Sheets

PROCESS FOR FORMING HIGH AND LOW VOLTAGE CMOS TRANSISTORS ON A SINGLE INTEGRATED CIRCUIT CHIP

FIELD OF THE INVENTION

The invention relates to the manufacture of complementary metal-oxide-semiconductor (CMOS) integrated circuits.

RELATED APPLICATIONS

This patent application as related to patent applications Ser. Nos. 07/324,059, entitled, "Technique for Forming Thick Gate Oxide and Thin Gate Oxide Transistors in a Common Integrated Circuit Chip", and 07/325,164 entitled, "Process for Forming Vertical Bipolar Transistors and High Voltage CMOS in a Single Integrated Circuit Chip", which are being filed concurrently with the present patent application and in which there is a common assignee and some common inventors.

BACKGROUND OF THE INVENTION

CMOS integrated circuits are finding increased use in electronic applications. There are at least two important classes of CMOS integrated circuits, low voltage circuits in which the operating voltages are no greater than about six volts and high voltage circuits in which the operating voltages are above about thirty volts. Moreover, an important difference in the two classes is that the higher operating voltages require that the channel region between the source and drain of the higher voltage MOS transistor be able to withstand the higher induced electric field without experiencing avalanche breakdown. As a consequence, the two classes have generally involved differences in form, as well as differences in parameters. Such differences have dictated enough differences in processing that each class typically has been formed in its own separate chip rather than combined with the other class in a common chip.

However, it is advantageous to have a process for forming both types in a common chip, or monocrystalline substrate, and processes have been proposed to this end.

However, such processes are generally quite complex and require considerable change from established processes.

There is desired an improved process for forming both high voltage CMOS and low voltage CMOS devices in a common chip that involves only a few changes in an established process for making the more common low voltage CMOS devices.

One favored form for realizing higher avalanche breakdown voltages to the field induced between the source and drain of an MOS transistor is the lightly doped drain (LDD) structure in which the drain includes a lightly doped extension portion intermediate between the channel region and the standard heavily doped drain portion.

Additionally, in a high voltage MOS transistor, it is usually advantageous to include a gate oxide whose thickness, typically at least 650 angstroms, is thicker than that normally used in a low voltage MOS transistor, typically no greater than about 400 angstroms. Such added thickness provides ruggedness that serves as added assurance against electrical over stress (eos) of the gate oxide layer.

SUMMARY OF THE INVENTION

The present invention is directed to a process for providing both high voltage and low voltage CMOS devices in a common chip that basically involves adding a single ion implantation step, some noncritical masking and mask design changes to an established n-type well low voltage CMOS integrated circuit process.

In particular, early in this novel process, the mask that is characteristically used with the standard donor ion implantation step for forming in a p-type substrate n-type wells for the p-channel (PMOS) transistors is modified additionally to form extension n-type wells for the high voltage n-channel (NMOS) transistors. Additionally, the novel process includes an added acceptor ion implantation step for forming p-type wells for use in forming the high voltage PMOS transistors. In particular, the parameters of the implantation step that forms the p-type extension well permits the standard field oxidation step to be used to drive-in the implanted ions.

Moreover, in a preferred embodiment for achieving additionally a thicker gate oxide layer in each of the high voltage transistors, at an intermediate stage in the process a mask used for localizing an oxide etching step is modified to protect the oxide in the active region of each high voltage transistor so that ultimately the gate oxide layer of each high voltage transistor is thicker than that of each low voltage transistor. It is to be noted that this technique for achieving a thicker gate oxide is the subject specifically of the first Ser. No. 07/324,059 of the two above-mentioned related patent applications.

The invention will be better understood from the following more detailed description taken in conjunction with the appended claims and with the accompanying drawing.

BRIEF DESCRIPTION OF THE DRAWINGS

It is to be noted that the drawing is not true to scale. Moreover in the drawing, heavily doped regions (concentration of impurities of at least about $1 \times 10^{19}$ impurities/cm$^3$) are designated by a plus sign (e.g., n+) and lightly doped regions (concentrations of no more than about $5 \times 10^{16}$ impurities/cm$^3$) by a minus sign (e.g., p−).

DETAILED DESCRIPTION

Figure 1A:
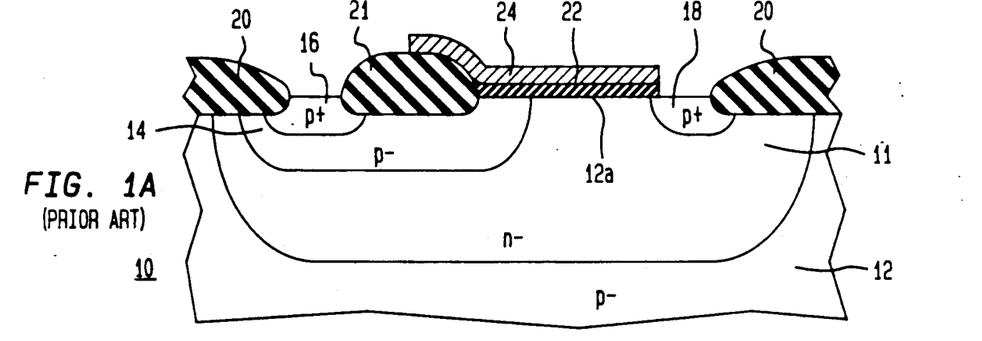
FIGS. 1A, 1B, 1C and 1D are cross sections of known forms of a high voltage PMOS transistor, a high voltage NMOS transistor, a low voltage PMOS transistor and a low voltage NMOS transistor, respectively, all sharing a common substrate for processing in accordance with the invention in a common substrate.

Referring now to FIG. 1A, there is shown a known form of a high voltage PMOS transistor 10 of the lightly doped drain (LDD) type included entirely in a lightly doped n-type well 11 that is formed in a lightly doped p-type substrate 12. Nested within the n-type well 11 is a lightly doped p-type well 14 that serves as the lightly doped drain extension characteristic of an LDD PMOS transistor. Heavily doped p-type region 16 in well 14 serves as the standard drain of the transistor. Heavily doped p-type region 18 in well 11 serves as the source of the transistor.

Relatively thick field oxide regions 20 at a top surface 12a of substrate 12 define the ends of the active surface region of transistor 10 and serve to isolate it from other transistors at the surface of the substrate 12. Generally, such regions are predominantly of silicon dioxide but are conventionally described as of "oxide" or "silicon oxide" and will be so termed hereafter. Moreover, other layers used in the process of the invention that will be termed "oxide" or "silicon oxide" layers generally also are layers predominantly of silicon dioxide.

A region 21 of thick field oxide is also optionally included over an intermediate region of the p-well 14. A relatively thin silicon oxide layer 22 serves as the gate dielectric and extends over surface 12a from an edge of the p-type source 18 to region 21 of the field oxide. A polysilicon gate electrode 24 extends over the gate oxide layer 22 and overlaps a portion of the field oxide region 21. Such overlap is known to permit the gate electrode 24 to serve also as a quasi-field plate to improve the breakdown characteristics of the transistor.

In a typical embodiment designed to have a threshold voltage of about $-0.85$ volts and an avalanche breakdown voltage of at least minus thirty volts, the substrate 12 has an average acceptor concentration of about $5 \times 5$ impurities/cm$^3$ to provide a resistivity of around 18 ohms-cm, the gate oxide layer 22 is about 650 angstroms thick; the channel between p-well 14 and p-type source 18 is about 4 microns long; the portion of the p-well 14 that extends under the gate electrode 22 before it starts to overlap the field oxide region 21 is about 1 micron long and the length of the gate electrode overlap of the field oxide region 21 is about 2 microns. The source and drain are each doped to about $1 \times 10^{19}$ impurities/cm$^3$ and are about 0.3 microns deep. The n-well 11 is about 4 microns deep and has an average concentration of about $1 \times 10^{16}$ impurities/cm$^3$, and the p-well 14 has an average concentration of about $4 \times 10^{16}$ impurities/cm$^3$ and is about 1 micron deep.

Figure 1B:
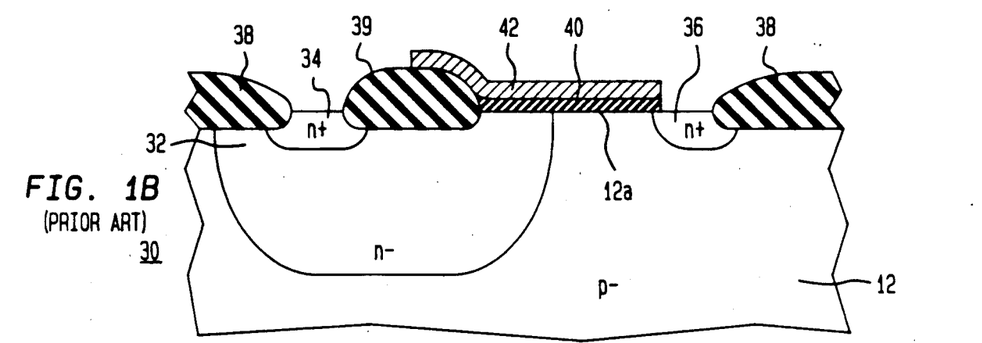

Referring to FIG. 1B, there is shown a high voltage NMOS transistor 30 of the LDD type which includes the p-type substrate 12 within which is formed a lightly doped n-type well 32 that serves to provide the characteristic lightly doped drain extension. Within it there is formed a standard heavily doped n-type drain 34. Heavily doped n-type region 36 at the surface 12a in the p-type substrate 12 serves as the source. Thick field oxide regions 38 define the active surface region of the transistor 30. A thin gate oxide layer 40 overlies the surface 12a and extends to an intermediate thick field oxide region 39 that extends between the drain 34 and the end of the gate oxide layer 40. A polysilicon gate electrode 42 extends over the gate oxide layer 40 and overlaps a thick field oxide portion 39, as in the LDD PMOS transistor of FIG. 1A, to serve also as a quasi-field plate.

To make the processing of this LDD NMOS transistor 30 compatible with the processing of the LDD PMOS transistor 10 of FIG. 1A, the basic parameters of the substrate 12, the thicknesses of the gate oxide layers 22 and 40, and the doping and depth of n-type wells 11 and 32 were the same in the two transistors. Additionally, in transistor 30 the n-type source 36 and drain 34 are doped to an average concentration of $1 \times 10^{20}$ donors/cm$^3$ and are about 0.3 microns deep. The length of the channel between the n-type source 36 and the n-type extension well 32 is about 7 microns and the various dimensions of gate electrode overlaps are the same as in the PMOS transistor 10. In transistor 30, the threshold voltage is about 1.4 volts and the avalanche breakdown voltage is at least 30 volts.

Figure 1C:
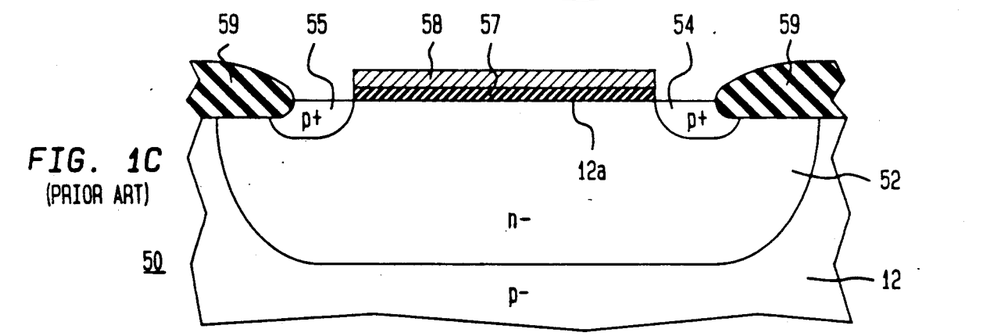

Referring now to FIG. 1C, there is shown a conventional low voltage PMOS transistor 50 which includes as before the p-type substrate 12 in which is formed a lightly doped n-type well 52. A heavily doped p-type source 54 and drain 55 are spaced apart within the n-type well 52. Gate oxide layer 57 and polysilicon gate electrode 58 overlie the portion of surface 12a lying between the source 54 and drain 55 in the fashion characteristic of a PMOS transistor. Thick field oxide regions 59 define the ends of the active surface region of the transistor 50.

For compatibility of processing, the doping of the source 54, drain 55, substrate 12 and n-type well 52 are the same as those of the corresponding elements of LDD PMOS transistor 10 shown in FIG. 1A. The length of the channel between source 54 and drain 55 is also about 1.5 microns and the thickness of the gate oxide in this low voltage transistor is about 400 angstroms to provide a threshold voltage of $-0.75$ volts. The avalanche breakdown voltage is at least about $-15$ volts.

Figure 1D:
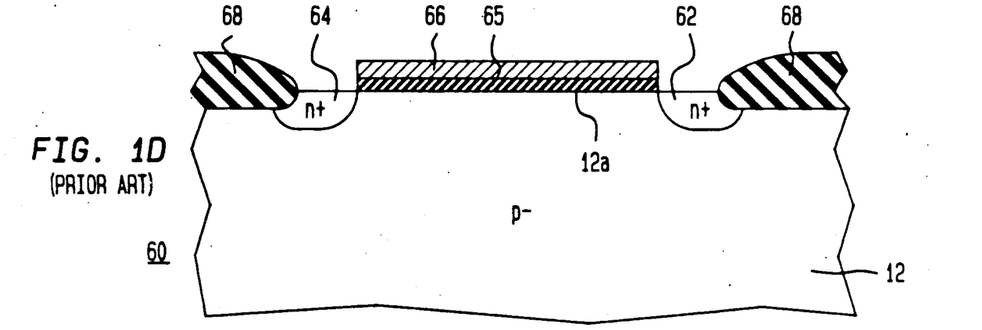

Referring now to FIG. 1D, there is shown a conventional low voltage NMOS transistor 60. It, too, is formed in lightly doped p-type substrate 12 and includes heavily doped n-type source 62 and heavily doped n-type drain 64 which are spaced apart at the surface 12a. A thin gate oxide layer 65 and a polysilicon gate electrode 66 overlie the channel between the source 62 and the drain 64 in characteristic fashion. Thick field oxide regions 68 define the ends of the active surface region of transistor 60.

For compatibility in processing, the doping of the source 62, drain 64, and substrate 12 of transistor 60 are similar to those corresponding elements of the LDD NMOS transistor shown in FIG. 1B, and the gate oxide layer 65 has the thickness of gate oxide layer 57 of the complementary PMOS transistor 50 shown in FIG. 1C. The length of the channel of transistor 60 is 1.5 microns. The threshold voltage and the avalanche breakdown voltage of transistor 60 are $+0.75$ volts and $+10$ volts, respectively.

As previously indicated, the invention is primarily a process for forming efficiently the four forms of transistors, shown in FIGS. 1A, 1B, 1C and 1D, in a common substrate, so that there may be provided individual chips that include one or more of each of the four forms for use in a monolithic integrated circuit. However, if desired, after processing the four forms in a common substrate, the substrate may be diced in a fashion to provide individual chips that include less than all four forms.

Typically, in such a monolithic integrated circuit, the low voltage transistors are used at the logic and intermediate stages for signal processing, while the high voltage transistors are used at input and output stages of an integrated circuit. Such an integrated circuit is expected to be particularly useful for driving vacuum fluorescent displays or automatic data buses. Additionally, such an integrated circuit makes it possible for logic level voltage supplies to be derived from an on-chip voltage regulator circuit.

Of course, a variety of other functions can be provided advantageously by an integrated circuit that includes both high voltage and low voltage CMOS pairs of transistors.

It is appropriate now to describe an illustrative embodiment of the process of the invention.

Figure 2A:
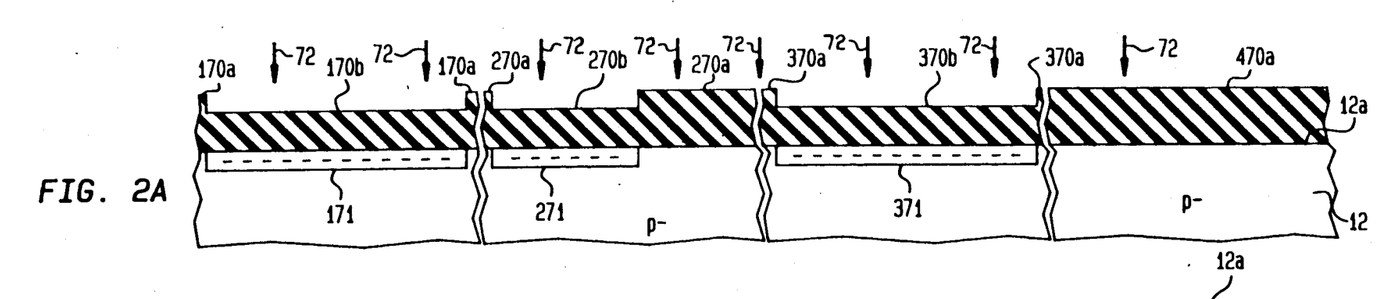
FIGS. 2A, 2B, 2C, 2D, 2E, 2F, 2G, 2H and 2I are cross sections of a substrate at selected stages, as it is being processed in accordance with an illustrative embodiment of the invention to include one of each of the four transistor forms shown in FIGS. 1A, 1B, 1C and 1D.

Referring now to FIG. 2A, there is shown a lightly doped p-type substrate 12 in which one of each of the transistors shown in FIGS. 1A, 1B, 1C and 1D is to be formed. Substrate 12 is a portion of a monocrystalline silicon wafer that has been cut so that its top surface 12a lies along a <100> crystal plane, as is usual in MOS technology. The wafer of which the substrate 12 is part is made just thick enough to be handled conveniently, typically between 23 and 26 mils. The lateral dimensions of the wafer being processed are generally large enough so that the wafer may subsequently be diced into a number of chips, each of which includes one or more transistors of the kind described. However, the figures will focus on a substrate portion that includes just one of each.

The processing begins by providing donor-implanted surface regions 171, 271 and 371 spaced apart in the substrate 12, as shown in FIG. 2A, that will be used to form n-type wells. To this end, a layer of silicon oxide thick enough to be a barrier (about 5500 angstroms thick) is first thermally formed on the top surface 12a of the substrate 12. Then, by use of photolithography, this oxide layer is patterned to bare each of those portions of the top surface 12a of the silicon substrate 12 where an n-type well is to be included. Then the substrate 12 is treated to form a layer of thinner oxide (e.g., 500 angstroms) over the bared silicon portions. These thin oxide layer portions are designed primarily to protect the surface 12a of the silicon substrate 12 during the subsequent ion implantation without significantly blocking the implantation, while the thicker layer portions are intended to block such implantation into the underlying regions of the substrate 12.

The wafer is then implanted with the donor ions to form ion implanted regions localized at surface portions underlying the thin oxide layer portions. Typically the implantation is of phosphorus at an accelerating voltage of about 125 KeV to a dosage of $4.5 \times 10^{12}$ ions-cm$^{-2}$. Advantageously, the implantation is done in known fashion at an angle from the normal to minimize channeling effects.

The result is shown in FIG. 2A where the top surface 12a of the substrate 12 includes layer portions 170a, 270a, 370a and 470a of thick oxide and layer portions 170b, 270b and 370b of thin oxide and donor-implanted regions 171, 271 and 371 underlying the thin oxide layer portions 170b, 270b and 370b, respectively. Arrows 72 denote the ions being implanted.

Additionally, as is discussed more fully in the second of the above-identified related applications, a vertical n-p-n bipolar transistor may optionally be formed in the common substrate with essentially no additional steps. In such an instance, a fourth n-type well would be formed in the substrate by the same implantation used to form the three n-type wells shown. This fourth well would serve as the collector of the vertical n-p-n transistor.

Figure 2B:
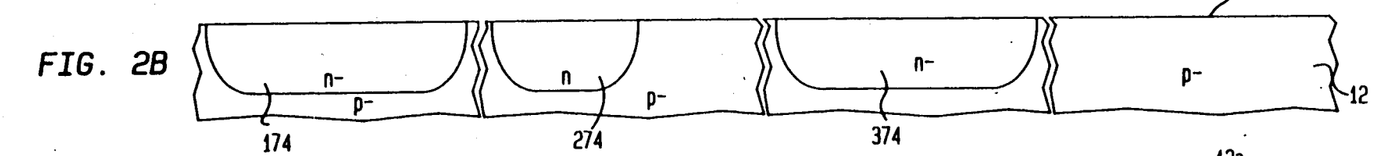

Next, the substrate 12 is heated to drive the phosphorus ions deeper into the substrate 12 and form n-type wells therein. Typical heating conditions are 1200° C. for 4 hours. Then the substrate 12 is treated to clean off the oxide layers on the top surface of the substrate. There then results the structure shown in FIG. 2B where the phosphorus implanted regions have formed after drive-in the n-type wells 174, 274 and 374.

Figure 2C:
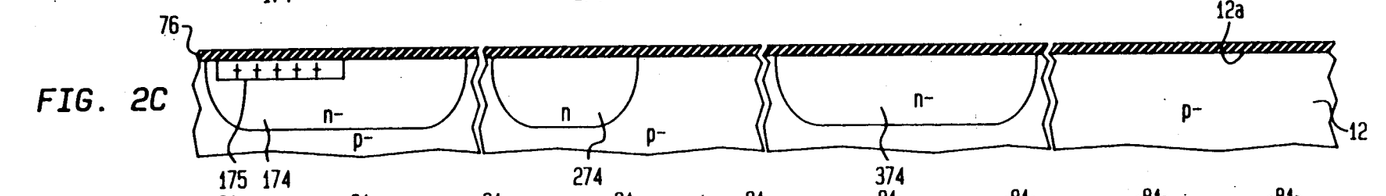

Next, as shown in FIG. 2C, there is formed an acceptor-implanted region 175 nested selectively within n-well 174 that will serve, after drive-in, as the p-type drain extension well in the high voltage PMOS transistor. To this end, a protective oxide layer 76, typically 500 angstroms thick, is grown over the top surface of the substrate, and a masking layer of photoresist (not shown) deposited over it. The photoresist is then patterned to expose the underlying protective oxide layer where region 175 is to be formed, but elsewhere it is left as a mask to block the acceptor implantation. Boron is then implanted selectively to form the region 175. Illustratively, the boron is implanted at 120 KeV at a dosage of $1.5 \times 10^{13}$ ions-cm$^{-2}$. By this choice, advantageously, the drive-in of the boron to form the p-type drain extension well can be postponed and made to occur during the heating step used subsequently to form the thick field oxide regions.

Moreover, if a vertical n-p-n transistor is to be formed in the substrate as mentioned above, the boron implantation step is also used to form a boron-implanted region in the fourth n-type well that can be used to form the p-type base of the n-p-n vertical transistor.

To provide the various thick field oxide regions, a mask is first formed over the top surface 12a of the substrate 12 to localize the oxidation as desired.

To this end, a layer, illustratively of silicon nitride about 2000 angstroms thick, is formed over the thin oxide layer 76 by the usual low pressure chemical vapor deposition (LPCVD) process. This nitride layer is then patterned photolithographically in the usual fashion to remove the nitride where thick field oxide regions are desired, leaving the mask formed by regions 178, 278, 378, and of 478 silicon nitride, seen in FIG. 2D.

Figure 2D:
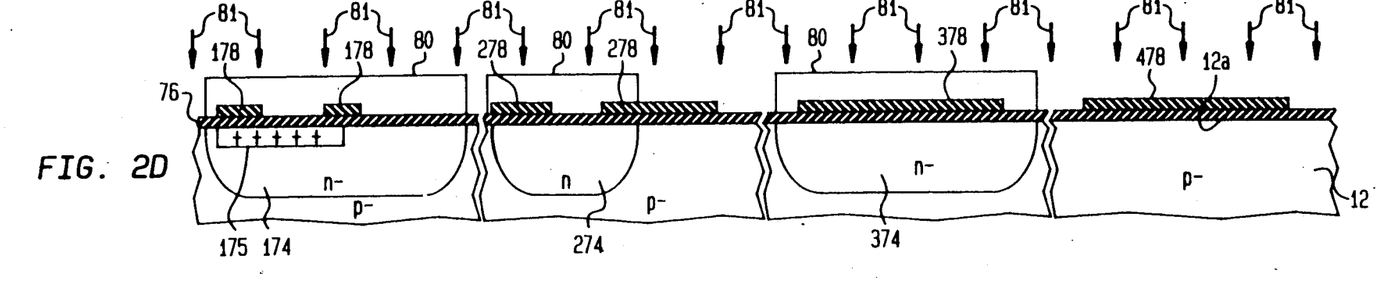

Moreover, it is usually advantageous to insure against undesirable surface inversion effects in the substrate 12 under the thick field oxide regions. For this purpose, it is the usual practice to implant acceptor ions selectively in the p-type surface 12a portions of the substrate 12 that underlie the thick field oxide regions. To this end, a layer of photoresist that is then patterned to form the mask 80 is provided over the silicon nitride mask, as seen in FIG. 2D. This mask 80 leaves exposed surface regions that are not included within any of the n-type wells nor covered with silicon nitride. The substrate 12 is then implanted with boron, denoted by arrows 81 in FIG. 2D, illustratively at a dosage of $1.4 \times 10^{13}$ ions-cm$^{-2}$ at an accelerating voltage of 35 KeV. The low accelerating voltage results in a very shallow implant. To keep the drawing simple, the effect of this implantation in the composition of the substrate 12 is not reflected in FIG. 2D and the subsequent figures, since only the concentration of impurities, and not the conductivity type of the substrate, is affected.

After this implantation step, the photoresist mask 80 is removed to expose the patterned silicon nitride 178, 278, 378 overlying the surface substrate 12. The substrate 12 is then heated at a temperature of 1050° C. for about 4 hours to form the desired thick field oxide regions, typically about 8500 angstroms thick, over the portions of the surface 12a not protected by the patterned silicon nitride. This heating step also serves to drive-in the boron implanted in region 175 to form a p-type extension well 182 (see FIG. 2E) in n-type well 174.

Figure 2E:
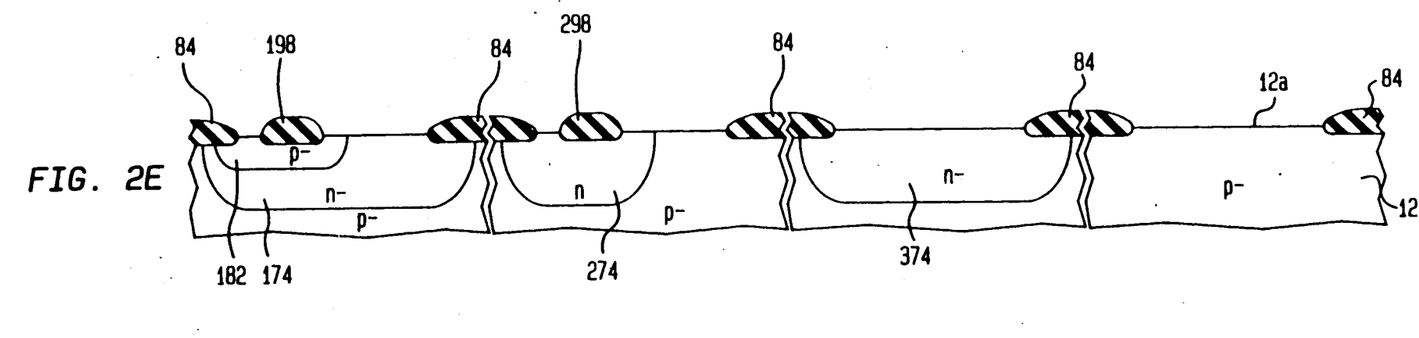

Next, the top surface 12a of the substrate 12 is bared of all but the thick field oxide regions. To this end, the oxide formed over the silicon nitride mask during the field oxidation, the silicon nitride mask, and finally the thin oxide that was under the silicon nitride mask are removed, usually in turn. The thicker field oxide regions not normally are little affected by these steps. The resultant is seen in FIG. 2E where p-type extension well 182 is nested in n-type well 174 and thick oxide regions 84 are seen formed where needed over the surface of the substrate to define the ends of the active surface areas of the various transistors and to form the intermediate oxide regions used to form the quasi-field plates in the LDD types of transistors seen in FIGS. 1A and 1B.

Next, a thin layer of oxide, illustratively about 400 angstroms thick, is grown over the portions of the surface of the silicon substrate 12 that are exposed between the thick oxide regions 84. This is then advantageously followed by a light and shallow implant of boron ions over the regions of the substrate corresponding to the future active regions of the transistors to set the surface potential of the active surfaces of the transistors and to adapt such surfaces better for the enhancement mode transistor operation, typical of the transistors formed by the process of the invention. An illustrative dosage is $1.35 \times 10^{12}$ ions-cm$^{-2}$ at an accelerating voltage of 35 KeV. The effect of this implantation step also is not reflected in the figures since it affects only surface concentration and not surface conductivity type of the substrate 12.

As previously mentioned, in the preferred embodiment of the invention being described, the high voltage transistors advantageously are provided with thicker gate oxide layers than are the low voltage transistors. To this end, a layer of photoresist useful for masking is then deposited over the top surface 12a of the substrate 12 and selectively removed from the regions corresponding to the active surface areas of the low voltage PMOS and NMOS transistors to bare the just-formed thin silicon oxide layer over such areas. This bared thin oxide layer is then selectively removed from the regions corresponding to the active surface areas of the low voltage transistors.

Figure 2F:
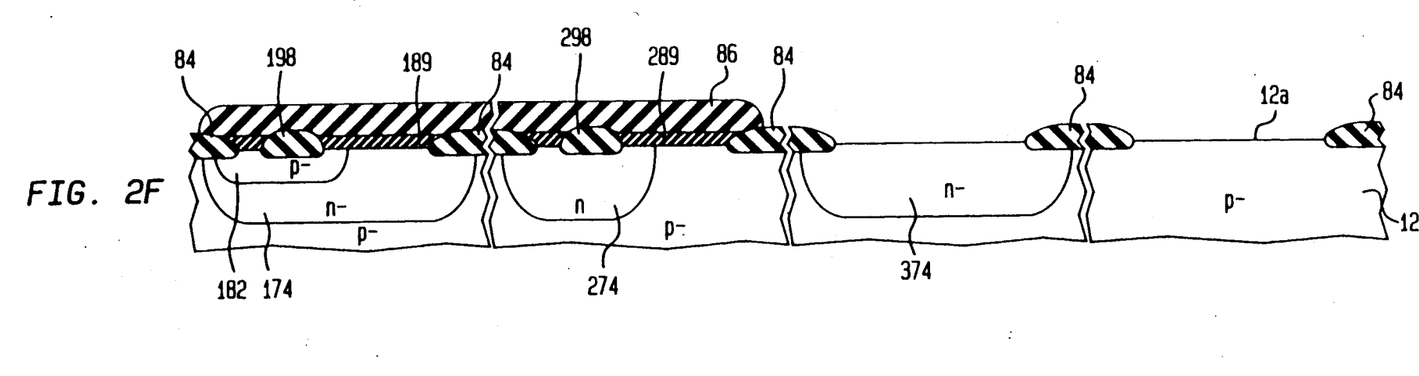

The resultant is shown in FIG. 2F in which patterned photoresist layer 86 masks the portion of the substrate 12 that will house the high voltage CMOS transistors and thus has protected the thin oxide layer 88 previously formed over the active regions of these transistors. Over the surface regions where the low voltage transistors are to be formed, there is no photoresist mask and the previously formed thin oxide layer is now absent.

Now the formation of the gate oxide layers can be completed. To this end, the remainder of the photoresist layer 86 is removed. Then the substrate 12 is again exposed to an oxidizing ambient at an elevated temperature to grow a fresh oxide layer of about 400 angstroms over the bare surface 12a areas where the low voltage transistors are to be formed and also to thicken the pre-existing 400 angstroms oxide layer 88 that remains where the high voltage transistors are to be formed.

In some instances, since the first formed thin oxide layer was exposed during the threshold implant and so is boron-rich, it may be preferable instead to remove completely such thin oxide layer before it is patterned. After its removal, there is grown a clean thin oxide layer over the substrate 12. This clean oxide layer is removed selectively where a thin gate oxide is desired. Then the additional oxidation step is used as before to grow a new thin oxide layer where the thinner gate oxide layer is desired and to thicken the clean oxide layer that remained where the thicker gate oxide layer is desired.

Figure 2G:
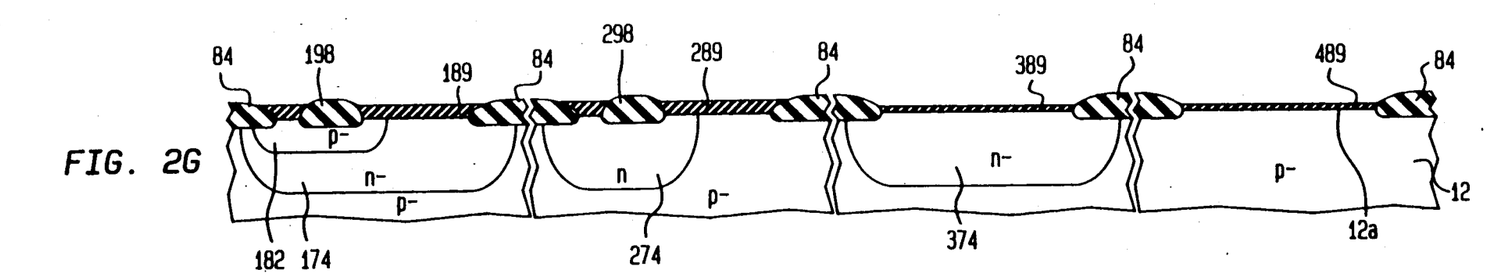

As is shown in FIG. 2G, there now results the desired greater thickness in oxide layers 189 and 289, over the surface area where the high voltage transistors are to be formed, than in oxide layers 389 and 489 over the surface areas where the low voltage transistors are to be formed.

Next, a polysilicon layer that will provide the gate electrodes for all of the transistors is deposited over the top surface of the substrate 12 in any of the known ways. Typically, this involves low pressure chemical vapor deposition to form a polysilicon layer about 3500 angstroms thick.

The polysilicon layer is generally doped to make it highly conductive, as is desired for its role as the gate electrode. Illustratively, this is done by heating the substrate 12 after the layer has been deposited, in an ambient of phosphine gas in known fashion to saturate the polysilicon with phosphorus. Before the polysilicon layer is patterned to define the gate electrodes, it advantageously is deglazed (etching away of the phosphosilicate layer formed on its surface during the doping step).

Figure 2H:
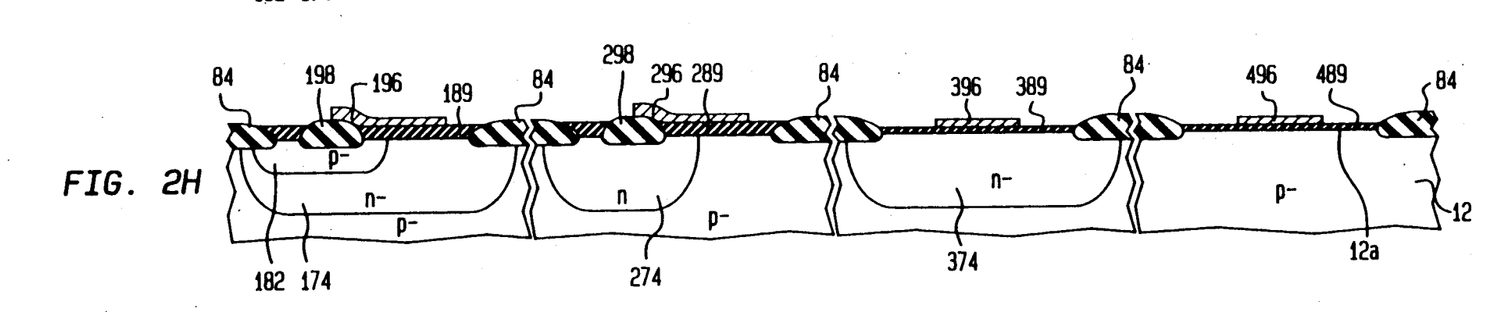

To pattern the polysilicon layer, typically it is coated first with a layer of photoresist and this photoresist layer is patterned to mask the polysilicon where the gate electrodes of the various transistors are to be formed. Then the exposed polysilicon is removed to leave only the polysilicon electrodes 196, 296, 396, and 496, seen in FIG. 2H.

Next, the source and drain regions of the four forms of transistors are formed, illustratively by ion implantation using the polysilicon electrodes as masks to insure proper alignment of the source and drains.

It is usual to form the heavily doped n-type source and drain regions before the heavily doped p-type source and drain regions. However, it is usually advantageous to form a temporary thin layer of oxide over the polysilicon electrodes to protect them during the subsequent processing.

However, before the implantation for the formation of these heavily doped regions, a layer of photoresist is provided over the substrate 12, and this photoresist layer is patterned to open areas where the substrate 12 is to be implanted with donor ions to form the heavily doped n-type regions that serve as the source and drains of the NMOS transistors.

Illustratively, these heavily doped n-type regions are formed by a double implantation, first with arsenic at a dosage of $6.5 \times 10^{15}$ ions-cm$^{-2}$ at an accelerating voltage of 100 KeV, and then with phosphorus at a dosage of $1 \times 10^{14}$ ions-cm$^{-2}$ at an accelerating voltage of 70 KeV. This implantation is followed by a 15-minute anneal at 900° C.

Moreover, if a vertical n-p-n is to be formed, this implantation sequence is also used to form the emitter and a collector contact region of the vertical n-p-n transistor.

Figure 2I:
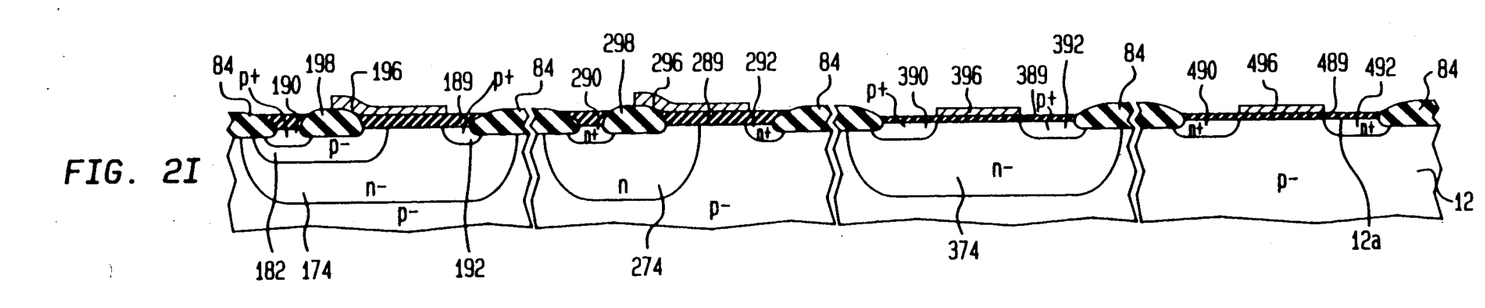

Next, the heavily doped p-type sources and drains of the PMOS transistors are formed. To this end, a layer of photoresist is again formed over the substrate and then patterned to expose regions where the p-type sources and drains are to be formed by implantation of acceptor ions. For forming these, illustratively the substrate is implanted with boron fluoride (BF$_2$) at a dosage of $3 \times 10^{15}$ ions-cm$^{-2}$ at an accelerating voltage of 70 KeV. After the implantation, the photoresist mask is cleaned off. FIG. 2I shows the resultant. This represents the basic structure needed to provide the desired integration of low voltage CMOS devices and high voltage LDD CMOS devices in a common substrate.

Moreover, this boron implantation step also would be used to form a base contact region for the vertical n-p-n transistor.

As seen in FIG. 2I, a high voltage LDD PMOS transistor is formed in the n-type well 174. It includes the p-type extension well 182 within which is formed the p-type drain 190. The p-type source 192 is formed in the n-type well 174. The polysilicon gate electrode 196 overlies relatively thick oxide gate layer 189 and overlaps the intermediate field oxide region 198.

A high voltage LDD NMOS transistor is formed in the p-type substrate 12 and includes n-type source 292 and n-type drain 290 included within n-type extension well 274. Polysilicon gate electrode 296 overlies relatively thick gate oxide layer 289 and also overlaps intermediate field oxide region 298.

A low voltage PMOS transistor is formed in the n-type well 374 by p-type source 390 and p-type drain 392. Polysilicon gate electrode 396 overlies relatively thin gate oxide layer 389.

A low voltage PMOS transistor is formed in the p-type substrate 12 by n-type source 492 and n-type drain 490 and polysilicon gate 496 overlying relatively thin gate oxide layer 489.

However, for use in a system, there remains the need to provide ohmic contacts to the various electrodes of the transistors. Also, there remains to be provided the various coatings, generally included for passivating and protecting the surfaces of the substrate 12, and the metal levels needed to interconnect the individual transistors into an integrated circuit.

Various known techniques are available for this further processing and the invention is not dependent on any particular such techniques.

However, an illustrative example of such further processing is as follows.

Proceeding further, the substrate is coated with a layer of phosphosilicate glass illustratively about 5000 angstroms thick, followed by a short heating cycle at 900° C. for densification of the deposited glass in known fashion. Before depositing a metal contact layer, it is advantageous first to planarize the surface which has become substantially non-planar because of the stacking thereover of the various patterned layers.

Advantageously, this is done by spinning over the substrate 12 a layer of glass, typically a few thousand angstroms thick, to smooth its surface by filling any depressions at the surface. Advantageously, this is followed by heating to about 825° C. for about ten minutes in nitrogen, to densify the spun-on glass.

Then, to permit low resistance ohmic contacts to be provided to the sources, drains and gate electrodes of the various transistors, contact openings are formed in the glass coatings where such contacts are to be provided.

To this end, the spin-on-glass (sog) layer is coated with a layer of photoresist that is then patterned to expose regions where there are to be formed contacts to the various sources, drains and gate electrodes through the glass layers.

Advantageously, to form well-defined contact openings with tapered sidewalls to facilitate good fill by the contact metal, the wafer is first treated with an isotropic wet etchant, such as aqueous hydrofluoric acid, and this is followed by an anisotropic dry plasma etch in known fashion.

Illustratively, the metal contacts are formed by first depositing over the surface a 6000 angstroms thick layer of an aluminum-copper-silicon alloy (advantageously by weight about 98 parts aluminum, 1 part copper, 1 part silicon). This metal layer is then coated with a layer of photoresist that is patterned in known fashion to expose the metal layer where it is not needed for the contacts desired, and this unneeded metal is then appropriately removed by a suitable technique.

It is also usual to provide a second level of metal to interconnect the various electrodes of the transistors, as desired, and to provide bonding pads by which the integrated circuit device may be interconnected into a system. To this end, to provide electrical isolation between the first level metal already deposited and a second level metal to be deposited, a layer of silicon oxide, typically about 8000 angstroms thick, is deposited over the surface of the substrate 12, illustratively by a plasma deposition process. The resulting surface, which tends to be non-planar, advantageously is made more planar, as before, by spinning a layer of glass, about 5000 angstroms thick, over the surface and then etching most of it back to leave a substantially planar surface. Over this there is further deposited, typically by a plasma process, another layer of silicon dioxide about 4000 angstroms thick.

Again, before deposition of the second level metal, vias are formed in the various layers deposited to expose portions of the first level metal that are to be contacted by the second level metal. To this end, the top surface is again covered with a masking layer of photoresist that is then patterned to form opening where vias are to be formed in the deposited layers. After the openings in the mask are formed, corresponding openings are formed in the layers of deposited oxide and the intermediate layer of spun-on-glass to expose the first level metal where contact to a second level is desired.

This is followed by deposition of the second level metal, which illustratively may be the same aluminum-copper-silicon alloy used for the first level metal. This second level metal is then appropriately patterned as desired.

Then, it is typical to deposit a layer of silicon nitride, generally by plasma enhanced chemical vapor deposition (PECVD), over the surface of the wafer to protect the second level metal.

There finally remains the need to bare the second level metal where bonding pads are to be provided. This is typically done by first depositing a layer of photoresist over the surface that is then patterned to expose regions of the second level where the bonding pads are to be formed.

Finally, it is usually advantageous to heat the substrate 12 at about 425° C. for about an hour in a hydrogen-atom atmosphere to passivate the metals.

It is to be understood that the specific process described is merely illustrative of the general principles of the inventions and that various changes may be made without departing from the spirit and scope of the invention. For example, there may be differences in the dimensions of the various layers and regions described. Additionally, there may be differences in the parameters of the various steps involved including differences in materials and dosages employed, as well as temperatures, times, and accelerating voltages employed. Moreover, in some instances, the particular order of the steps may obviously be changed without affecting the spirit of the invention.

The specific process described involved a p-type substrate as the bulk in which an n-type well was formed for use by each of the PMOS and high voltage NMOS transistors. Alternatively, an n-type substrate can be used as the bulk and a separate p-type well formed therein for use by each of the NMOS and high voltage PMOS transistors. This would necessitate corresponding adjustment in the remainder of the processing.

Moreover, ordinarily the wafer will be eventually diced into chips, each of which includes one or more of each of the four different forms of MOS transistors that were processed in the wafer. However, in some instances, it may prove desirable to dice the wafer into some chips; for example, that include only the two high voltage forms and separate chips that include only the low voltage forms, and then to combine the two types of chips on a common printed circuit board or support for system use. This approach will still offer the benefit that both types of chips are processed in common on a single production line.

Moreover, while the preferred embodiment of the process included forming thicker gate oxide layers in the high voltage devices, this is not a necessary feature of the invention and may be avoided.

Additionally, as is discussed in the second (07/345,164) of the above-identified related patent applications, the process may be readily adapted to provide additionally vertical bipolar transistors in the common substrate.

The embodiments of the invention in which an exclusive property or privilege is claimed are defined as follows:

1. A process for forming in a common substrate of one conductivity type low voltage transistors of the one type conductivity type and of the opposite conductivity type and of the opposite conductivity type in which the high voltage transistors of both types are of the lightly-doped drain type, which include lightly doped drain extension areas, and the transistors of the one conductivity type are formed in wells of the opposite conductivity type characterized in that:

the lightly doped drain extension area of the opposite conductivity type of each of said high voltage transistors of the opposite conductivity type is formed as a well in common with the forming of the wells of the opposite conductivity type for the transistors of the one conductivity type;

the lightly doped drain extension area of the one conductivity type of each of said high voltage transistors of the one conductivity type is formed by separate implantation of the one conductivity type into its well of opposite conductivity type;

the drain extension area of the one conductivity type of each of said high voltage transistors of the one conductivity type are driven into the substrate during field oxidation of the substrate; and a thicker gate oxide layer is selectively formed in each of said high voltage transistors by growing a first oxide layer both where the gate of the high voltage transistor and the gate of each of the low voltage transistors are to be provided, removing the first oxide layer selectively where the gate of the low voltage transistor is to be formed, and then growing a second oxide layer where the first oxide layer was removed while simultaneously thickening the first oxide layer where the gate of the high voltage transistor is to be formed.

2. The process of claim 1, wherein more highly doped drain region areas in said lightly doped drain extension areas for said high voltage transistors are delineated by openings in said field oxide, drain regions for said low voltage transistors and source regions for both said low voltage and high voltage transistors are self-aligned to polysilicon gate electrodes, and polysilicon gate electrodes of said high voltage transistors overlap onto a field oxide segment that separates surface portions of the lightly doped extension areas and the more highly doped areas of the drains of the high voltage transistors.

3. A process of forming in a common substrate an integrated circuit that includes both relatively low voltage CMOS transistors and relatively high voltage CMOS transistors of the LDD type comprising the steps of:

forming at a surface of a p-type substrate a non-uniform layer of silicon oxide having relatively thick and relatively thin portions;

irradiating the substrate with donor ions that are substantially blocked by the thick portions of the oxide and that are implanted in substrate regions underlying thin potions of the oxide;

heating the substrate to drive the implanted donor ions deeper and forming n-type wells in the substrate;

removing the non-uniform layer of silicon oxide and regrowing a second layer of uniform thickness;

forming over said surface a first masking layer that includes apertures overlying n-type wells in which are selectively to be formed p-type wells for serving as the lightly doped drain extensions of the high voltage PMOS transistors of the LDD type to be formed in the substrate;

implanting acceptor ions into the selected n-type wells through the apertures in the first masking layer;

depositing over the surface a layer of silicon nitride that is apertured where field oxide regions are to be formed both for separating transistors laterally in the substrate and for supporting quasi-field plates in the high voltage transistors;

forming over the surface a second masking layer that is apertured except where the n-type wells have been formed;

implanting acceptor ions into the substrate where not masked by the second masking layer or by the silicon nitride to provide a field implant that will underlie field oxide regions not overlying n-type wells;

removing the second masking layer from the surface;

heating the substrate both to form field oxide regions where the substrate is exposed between apertures in the silicon nitride layer and to drive-in the implanted acceptor ions for forming the p-type extension wells in the selected n-type wells where the high voltage LDD PMOS transistors are to be formed;

removing the silicon nitride layer and the uniform silicon oxide layer from the surface leaving the field oxide regions;

growing a first gate oxide layer over the surface of the substrate exposed between the field oxide regions;

irradiating the surface of the substrate with acceptor ions to set the surface potential of the substrate;

forming over the surface of the substrate a third masking layer that is apertured where the low voltage PMOS and NMOS transistors are to be formed;

removing the first gate oxide layer where not masked by the third masking layer;

removing the third masking layer;

heating the substrate to form a second gate oxide layer in active surface regions of the low voltage transistors and to thicken the first gate oxide layer in active surface regions of the high voltage transistors;

depositing a layer of polysilicon over the planar surface;

thermally doping the deposited polysilicon layer to increase its conductivity;

patterning the polysilicon layer to define polysilicon gate electrodes for the transistors;

depositing a fourth masking layer over the surface;

patterning the fourth masking layer to expose regions of the substrate where the sources and drains of the NMOS transistors are to be formed;

irradiating the substrate with donor ions to implant the sources and drains of the NMOS transistors;

removing the fourth masking layer;

depositing a fifth masking layer over the surface;

patterning the fifth masking layer to expose regions of the substrate where the sources and drains of the PMOS transistors are to be formed;

irradiating the surface to implant acceptor ions to form the sources and drains of the PMOS transistors;

removing the fifth masking layer; and forming conductive contacts to the sources, drains and gate electrodes of the transistors.

4. A process of forming in a common substrate an integrated circuit that includes both relatively low voltage CMOS transistors and relatively high voltage CMOS transistors of the LDD type comprising the steps of:

forming an initial masking layer on a surface of a p-type substrate for forming n-type wells for PMOS low and high voltage transistors and also for forming a lightly doped drain extension area for an NMOS high voltage transistor;

irradiating the substrate with donor ions that are substantially blocked by protective portions of the masking layer and that are implanted in substrate regions underlying non-protective portions of the masking layer;

heating the substrate to drive the implanted donor ions deeper and to form said n-type wells and said lightly doped drain extension are for said NMOS high voltage transistor in the substrate;

removing the initial masking layer from said substrate surface and growing a silicon oxide layer of uniform thickness thereon;

forming on the uniform silicon oxide layer a second masking layer that includes apertures overlying n-type wells of the high voltage PMOS transistors, within which are selectively to be formed shallower p-type wells, for serving as lightly doped drain extension areas of the high voltage PMOS transistors;

implanting acceptor ions into the n-type wells of the high voltage PMOS transistors through the apertures in the second masking layer;

removing the second masking layer;

forming on the uniform silicon oxide layer a layer of silicon nitride that is apertured where field oxide regions are to be formed both for separating transistors laterally in the substrate and for supporting quasi-field plates in the lightly doped drain extension areas of both the PMOS and NMOS high voltage transistors;

forming on the silicon nitride layer a third masking layer that is apertured except where the n-type wells have been formed;

implanting acceptor ions into the substrate where not masked by the third masking layer or by the silicon nitride to provide a field implant that will underlie field oxide regions not overlying n-type wells;

removing the third masking layer;

heating the substrate both to form field oxide regions where the substrate is exposed between apertures in the silicon nitride layer and to drive-in the implanted acceptor ions for forming the p-type lightly doped drain extension areas in the n-type wells of the high voltage NMOS transistors;

removing the silicon nitride layer and the uniform silicon oxide layer from the substrate surface leaving the field oxide regions thereon, and exposing portions of the substrate surface therebetween;

growing a first gate oxide layer on the portions of the surface of the substrate exposed between the field oxide regions;

irradiating the surface of the substrate with acceptor ions to set the surface potential of the substrate;

forming over the surface of the substrate a fourth masking layer that is apertured where the low voltage PMOS and NMOS transistors are to be formed;

removing the first gate oxide layer where not masked by the fourth masking layer;

heating the substrate to form a second gate oxide layer in surface regions of the low voltage transistors where the first oxide layer was removed and to thicken the first gate oxide layer of the high voltage transistors;

depositing a blanket layer of polysilicon over the substrate surface;

doping the deposited polysilicon layer to increase its conductivity;

patterning the deposited polysilicon layer to define polysilicon gate electrodes for both the high voltage and the low voltage transistors, wherein the polysilicon gate electrodes of the high voltage PMOS and NMOS transistors are patterned to extend up onto field oxide over lightly doped drain extension areas of both PMOS and NMOS high voltage transistors, effective to provide full source-drain self-alignment with the gate electrode in the low voltage transistors and self-alignment between source and gate but not drain and gate of the high voltage transistors;

depositing a fifth masking layer over the substrate surface;

patterning the fifth masking layer to expose regions on the substrate where are to be formed the more highly doped drain areas and the sources of the high voltage NMOS transistors, and the sources and drains of the low voltage NMOS transistors, are to be formed;

irradiating the substrate with donor ions to implant more highly doped drain areas and the sources of the high voltage NMOS transistors and the sources and drains of the low voltage NMOS transistors;

removing the fifth masking layer;

depositing a sixth masking layer over the surface;

patterning the sixth masking layer to expose oxide covered regions on the substrate where are to be formed more highly doped drain areas and the sources of the high voltage PMOS transistors, and the sources and drains of the low voltage PMOS transistors;

irradiating the surface to implant acceptor ions to form the more highly doped drain areas and the sources of the high voltage PMOS transistors, and the sources and drains of the low voltage PMOS transistors;

removing the sixth masking layer; and forming conductive contacts to the sources and drains of the low voltage transistors, to the sources and more highly doped drain areas of the high voltage transistors, and to gate electrodes of the transistors.

5. A process of forming in a common substrate an integrated circuit that includes both relatively low voltage CMOS transistors and relatively high voltage CMOS transistors of the LDD type comprising the steps of:

forming an initial masking layer on a surface of a p-type substrate for forming n-type wells for PMOS low and high voltage transistors and also for forming a lightly doped drain extension area for an NMOS high voltage transistor;

irradiating the substrate with donor ions that are substantially blocked by protective portions of the masking layer and that are implanted in substrate regions underlying non-protective portions of the masking layer;

heating the substrate to drive the implanted donor ions deeper and forming said n-type wells and said lightly doped drain extension area for said NMOS high voltage transistor in the substrate;

removing the initial masking layer from said substrate surface and growing a silicon oxide layer of uniform thickness thereon;

forming on the uniform silicon oxide layer a second masking layer that includes apertures overlying n-type wells of the high voltage PMOS transistors, within which are selectively to be formed shallower p-type wells, for serving as lightly doped drain extension areas of the high voltage PMOS transistors;

implanting acceptor ions into the n-type wells of the high voltage PMOS transistors through the apertures in the second masking layer;

removing the second masking layer;

forming on the uniform silicon oxide layer a layer of silicon nitride that is apertured where field oxide regions are to be formed both for separating transistors laterally in the substrate and for supporting quasi-field plates in the lightly doped drain extension area of both the PMOS and NMOS high voltage transistors;

heating the substrate both to form field oxide regions where the substrate is exposed between apertures in the silicon nitride layer and to drive-in the implanted acceptor ions for forming the p-type lightly doped drain extension areas in the n-type wells of the high voltage PMOS transistors;

removing the silicon nitride layer and the uniform silicon oxide layer from the substrate surface leaving the field oxide regions thereon, and exposing portions of the substrate surface therebetween;

growing a first gate oxide layer on the portions of the surface of the substrate exposed between the field oxide regions;

irradiating the surface of the substrate with acceptor ions to set the surface potential of the substrate;

forming over the surface of the substrate a third masking layer that is apertured where the low voltage PMOS and NMOS transistors are to be formed;

removing the first gate oxide layer where not masked by the third masking layer;

heating and substrate to form a second gate oxide layer in surface regions of the low voltage transistors where the first oxide layer was removed and to thicken the first gate oxide layer of the high voltage transistors;

depositing a blanket layer of polysilicon over the substrate surface;

doping the deposited polysilicon layer to increase its conductivity;

patterning the polysilicon layer to define polysilicon gate electrodes of one type for the low voltage transistors and polysilicon gate electrodes of the second type for high voltage transistors, wherein the first type of gate electrode provides self-aligned source and drain for the low voltage transistors and the second type provides only self-aligned source for the high-voltage transistors, and further provides an overlap of polysilicon onto field oxide over the lightly doped drain extension areas of the high voltage transistors, effective to provide a quasi-field plate over those lightly doped drain extension areas;

depositing a fourth masking layer over the substrate surface;

patterning the fourth masking layer to expose regions on the substrate where are to be formed more highly doped drain areas and the sources of the high voltage NMOS transistors, and the sources and drains of the low voltage NMOS transistors;

irradiating the substrate with donor ions to implant more highly doped drain areas and the sources of the high voltage NMOS transistors, and the sources and drains of the low voltage NMOS transistors;

removing the fourth masking layer;

depositing a fifth masking layer over the surface;

patterning the fifth masking layer to expose oxide covered regions on the substrate where are to be formed more highly doped drain areas and the sources of the high voltage PMOS transistors, and the sources and drains of the low voltage PMOS transistors;

irradiating the surface to implant acceptor ions to form the more highly doped drain areas and the sources of the high voltage PMOS transistors, and the sources and drains of the low voltage PMOS transistors;

removing the fifth masking layer; and forming conductive contacts to the sources and drains of the low voltage transistors to the sources and more highly doped drain areas of the high voltage transistors, and to gate electrodes of the transistors.

* * * * *